(12) United States Patent
Zhang et al.

(10) Patent No.: US 8,889,549 B2
(45) Date of Patent: Nov. 18, 2014

(54) METHODS OF FORMING CONDUCTIVE STRUCTURES USING A SACRIFICIAL LINER LAYER

(71) Applicant: GLOBALFOUNDRIES Inc., Grand Cayman, KY (US)

(72) Inventors: Xunyuan Zhang, Albany, NY (US); Nicholas V. LiCausi, Watervliet, NY (US); Errol Todd Ryan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 45 days.

(21) Appl. No.: 13/766,898

(22) Filed: Feb. 14, 2013

(65) Prior Publication Data
US 2014/0227872 A1   Aug. 14, 2014

(51) Int. Cl.
*H01L 21/44*   (2006.01)
*H01L 21/768*   (2006.01)

(52) U.S. Cl.
CPC .................. *H01L 21/76831* (2013.01)
USPC .......................................... 438/667

(58) Field of Classification Search
None
See application file for complete search history.

(56) References Cited

U.S. PATENT DOCUMENTS 7,541,200 B1 *   6/2009   van Schravendijk et al. ..... 438/4
7,598,525 B2   10/2009   Kawano et al.

FOREIGN PATENT DOCUMENTS

EP   1655632 B1   3/2011

* cited by examiner

*Primary Examiner* — Scott B Geyer
(74) *Attorney, Agent, or Firm* — Amerson Law Firm, PLLC

(57) ABSTRACT

One illustrative method disclosed herein includes performing a first etching process to define a via opening in a layer of insulating material, performing at least one process operation to form a sacrificial liner layer on the sidewalls of the via opening, performing a second etching process to define a trench in the layer of insulating material, wherein the sacrificial liner layer is exposed to the second etching process, after performing the second etching process, performing a third etching process to remove the sacrificial liner layer and, after performing the third etching process, forming a conductive structure in at least the via opening and the trench.

22 Claims, 5 Drawing Sheets

METHODS OF FORMING CONDUCTIVE STRUCTURES USING A SACRIFICIAL LINER LAYER

BACKGROUND OF THE INVENTION

1. Field of the Invention

Generally, the present disclosure relates to the manufacture of sophisticated semiconductor devices, and, more specifically, to various methods of forming conductive structures, such as conductive lines/vias, using a sacrificial liner layer during the process of forming such conductive structures.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while inter-level (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing cross-talk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. In general, the damascene technique involves (1) forming a trench/via in a layer of insulating material, (2) depositing one or more relatively thin barrier or liner layers (e.g., TiN, Ta, TaN), (3) forming copper material across the substrate and in the trench/via, and (4) performing a chemical mechanical polishing process to remove the excess portions of the copper material and the barrier layer(s) positioned outside of the trench/via to define the final conductive copper structure. The copper material is typically formed by performing an electrochemical copper deposition process after a thin conductive copper seed layer is deposited by physical vapor deposition on the barrier layer.

However, as everything becomes more crowded on an integrated circuit product, problems may arise when employing traditional damascene techniques. One such problem will be discussed with reference to FIGS. 1A-1C, which depict an illustrative example of a trench-first metal hard mask type damascene process, wherein the trench is first patterned on to the hard mask and then the via lithography/etching processes are performed. FIG. 1A depicts an integrated circuit product 10 comprised of a plurality of illustrative conductive structures 12, e.g., conductive lines, formed in a layer of insulating material 14. An etch stop layer 16 is formed above the layer of insulating material 14. The layers 14, 16 and the conductive structures 12 may all be considered to be part of a metallization layer 15 of an integrated circuit product. Electrical connections are to be made to the conductive structures 12. Thus, another metallization layer 17 is formed above the metallization layer 15. In the depicted example, formation of the metallization layer 17 involves formation of a layer of insulating material 18 and an etch mask 19 comprised of first and second layers of material 20, 22. In one example, the layers of insulating material 14, 18 may be layers of so-called low-k (k value less than about 3.3) insulating material, the layer 16 may be a layer of silicon nitride, the layer 20 may be a TEOS based layer of silicon dioxide, and the layer 22 may be a hard mask made of a material such as titanium nitride.

FIG. 1A depicts the product 10 after several process operations have been performed. First, using known photolithography and etching techniques, a patterned photo-resist mask (not shown) was formed above the product 10 and the mask layer 19 was patterned as depicted. Thereafter, the photoresist mask was removed and one or more etching processes were performed through the patterned mask layer 19 to form the depicted via openings 24 through the layers 18, 16 so as to expose the underlying conductive structures 12. The via openings 24 may have a square, rectangular or round configuration when viewed from above.

FIG. 1B depicts the product 10 after another etching process was performed to form a trench for a conductive metal line that will run in the direction indicated by the double arrows 21. As depicted, a great deal of the region 18A of insulating material 18 between the via openings 24 is consumed during this line-etch process. More specifically, after the line/trench etch process depicted in FIG. 1B, the sidewalls of the region 18A are positioned at a very shallow angle 25 due to the excessive consumption of the region 18A of insulating material 18 between the via openings 24 during the line-etch process.

FIG. 1C depicts the product 10 after a barrier layer 28 and bulk copper material 26 have been formed above the device and subjected to one or more chemical mechanical planarization (CMP) processes using techniques well known to those skilled in the art and briefly described above. Such processes also result in the removal of the layer 22. Unfortunately, due to the excess consumption of the region 18A of the insulating material, and the resulting shallow angle 25 of the sidewalls of the remaining portion of the region 18A, problems may arise. Given the increased packing densities and crowding noted above, the space 30 between adjacent conductive structures, e.g., the conductive lines 12, is very small and an important design rule that is tightly controlled. However, in the case where there is the depicted excessive consumption of the region 18A, the distance 32 between one of the conductive structures 12 in the metallization layer 15 may be less than the allowable distance 30 as dictated by the design rules. Such a situation may lead to unacceptable performance degradation, e.g., an undesirable increase in cross-talk, a premature breakdown in the insulating material along the path indicated by the double arrows 32, which might lead to highly undesirable electrical shorts and/or circuit failure.

The present disclosure is directed to various methods of forming conductive structures, such as conductive lines/vias, using a sacrificial liner layer that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive structures, such as conductive lines/vias, using a sacrificial liner layer. One illustrative method disclosed herein includes performing a first etching process to define a via opening in a layer of insulating material, performing at least one process operation to form a sacrificial liner layer on the sidewalls of the via opening, performing a second etching process to define a trench in the layer of insulating material, wherein the sacrificial liner layer is exposed to the second etching process, after performing the second etching process, performing a third etching process to remove the sacrificial liner layer and, after performing the third etching process, forming a conductive structure in at least the via opening and the trench.

Another illustrative method disclosed herein includes performing a first etching process to define an opening in a layer of insulating material, forming a sacrificial liner layer in the opening and adjacent the sidewalls of the opening, performing a second etching process that removes some of the sacrificial liner layer and leaves residual portions of the sacrificial liner layer adjacent the sidewalls of the opening, performing a third etching process on the layer of insulating material, wherein the residual portions of the sacrificial liner layer are exposed to the third etching process, after performing the third etching process, performing a fourth etching process to remove the residual portions of the sacrificial liner layer and, after performing the fourth etching process, forming a conductive structure in at least the opening.

Yet another illustrative method disclosed herein includes forming a layer of insulating material above an etch stop layer, performing a first etching process to define a via opening in the layer of insulating material that exposes a portion of the etch stop layer, performing a conformal deposition process to form a sacrificial liner layer in at least the via opening and adjacent the sidewalls of the via opening, wherein the sacrificial liner layer covers the exposed portion of the etch stop layer, performing a second, reactive ion etching process on the sacrificial liner layer that uncovers the exposed portion of the etch stop layer and leaves residual portions of the sacrificial liner layer adjacent the sidewalls of the via opening, performing a third etching process on the layer of insulating material to define a trench in the layer of insulating material, wherein the residual portions of the sacrificial liner layer are exposed to the third etching process, after performing the third etching process, performing a fourth etching process to remove the residual portions of the sacrificial liner layer and, after performing the fourth etching process, forming a conductive structure in at least the via opening and the trench.

BRIEF DESCRIPTION OF THE DRAWINGS

The disclosure may be understood by reference to the following description taken in conjunction with the accompanying drawings, in which like reference numerals identify like elements, and in which.

Figure 1A:
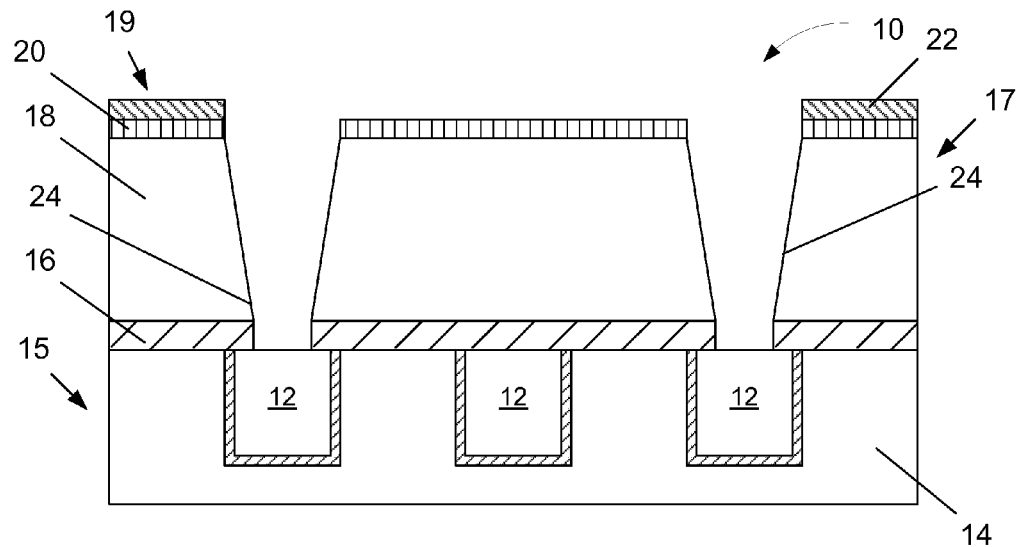
FIGS. 1A-1C depict an illustrative prior art method of forming conductive structures using a damascene process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures, such as conductive lines/vias, using a sacrificial liner layer. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

Figure 2A:
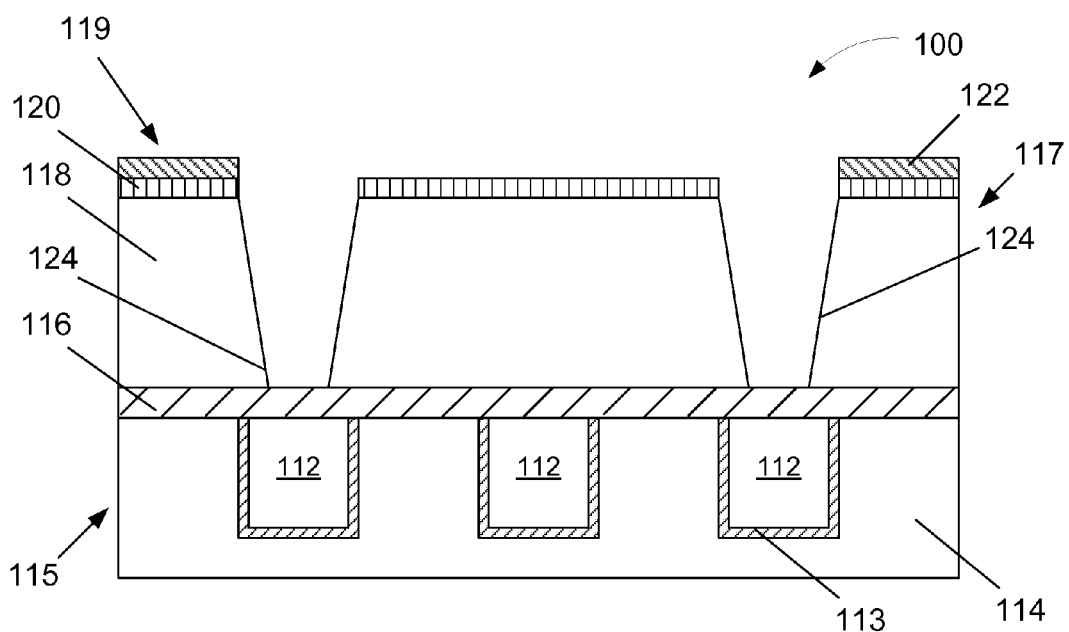
FIGS. 2A-2F depict various novel methods disclosed herein of forming conductive structures, such as conductive lines/vias, on an integrated circuit product using a sacrificial liner layer.

FIG. 2A is a simplified view of an illustrative integrated circuit device 100 at an early stage of manufacturing that is formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a conductive line or via, commonly found on integrated circuit devices.

The integrated circuit product 100 is comprised of a plurality of illustrative conductive structures 112, e.g., conductive lines, formed in a layer of insulating material 114. Also depicted in FIG. 2A is an illustrative etch stop layer 116. The layers 114, 116 and the conductive structures 112 may all be considered to be part of a metallization layer 115 that may be located at any level of the integrated circuit product 100. Electrical connections are to be made to the conductive structures 112. Thus, another metallization layer 117 is formed above the metallization layer 115. In the depicted example, formation of the metallization layer 117 involves formation of a layer of insulating material 118 and an etch mask 119 comprised of first and second layers of material 120, 122. In one example, the layers of insulating material 114, 118 may be layers of so-called low-k (k value less than about 3.3) insulating material, the layer 116 may be a layer of silicon nitride, the layer 120 may be a TEOS based layer of silicon dioxide, and the layer 122 may be a hard mask layer made of a material such as titanium nitride. The layers of material depicted in FIG. 2A may be formed by performing a variety of known processing techniques, such as a chemical vapor deposition (CVD) process, an atomic layer deposition (ALD) process, a physical vapor deposition (PVD) process, or plasma enhanced versions of such processes, and the thickness of such layers may vary depending upon the particular application.

The conductive structures 112 depicted in FIG. 2A and in the remaining portion of this specification are intended to be representative in nature as they may represent any type of conductive feature or structure on an integrated circuit product. In the depicted example, the conductive structures 112 include an illustrative barrier layer 113. In practice, there may be one or more such barrier layers 113 on a real-world device. The conductive structures described and discussed herein may be made of any type of conductive material, e.g., a metal or a metal alloy, such as copper or a copper-based material.

FIG. 2A depicts the product 100 after several process operations have been performed. First, using known photolithography and etching techniques, a patterned photo-resist mask (not shown) was formed above the product 100 and the mask layer 119 was patterned as depicted. Thereafter, the photoresist mask was removed and one or more via etching processes were performed through the patterned mask layer 119 to form the depicted via openings 124 through the layer of insulating material 118. As depicted, the via etching process stops on and exposes a portion of the etch stop layer 116. The via openings 124 may be of any desired shape, or configuration, e.g., square, rectangular or round when viewed from above.

Figure 2B:
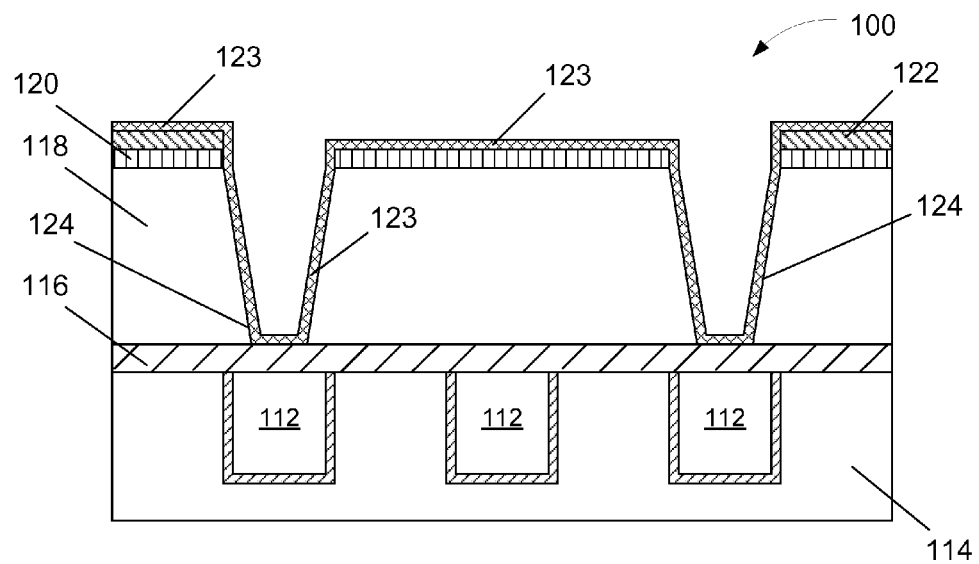

Next, as shown in FIG. 2B, a conformal deposition process, e.g., a CVD or ALD process, is performed to form a sacrificial liner layer 123 across the product 100 and in the via openings 124. As initially formed, the sacrificial liner layer 123 covers the portions of the etch stop layer 116 initially exposed by the via openings 124. The sacrificial liner layer 123 may be comprised of any material that may be selectively etched relative to the material of the layer of insulating material 118. In the case where the insulating material 118 is comprised of a low-k material, the sacrificial liner layer 123 may be comprised of a low-temperature (formed at a temperature of less than 400° C.) oxide, a low-temperature (formed at a temperature of less than 400° C.) amorphous silicon, silicon nitride, so-called Topez carbon (offered by Applied Materials), TiN, or other materials that may be selectively removed relative to the layer of insulating material and to copper, etc. The thickness of the sacrificial liner layer 123 may vary depending upon the particular application, e.g., 1-5 nm.

Figure 2C:
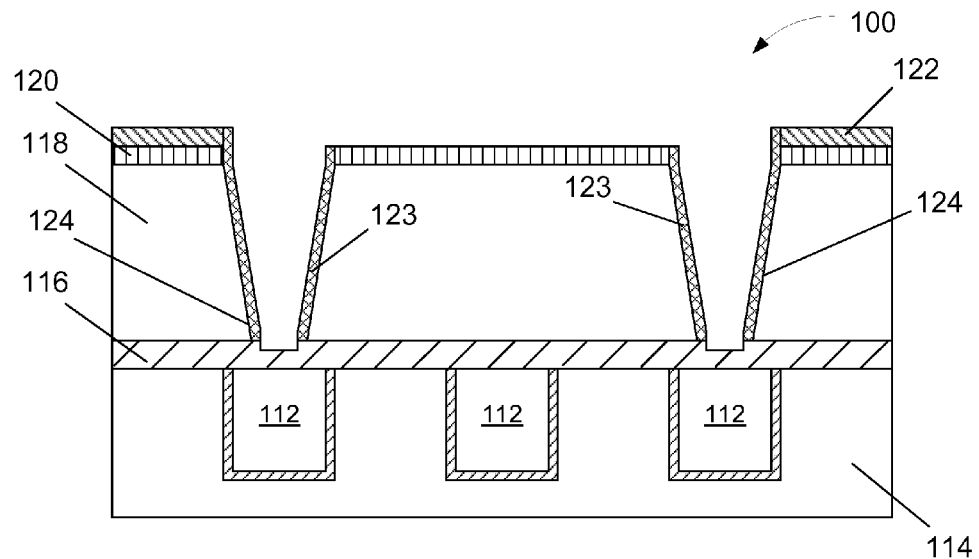

FIG. 2C depicts the product 100 after a dry, reactive ion (RIE) etching process was performed to remove the horizontally oriented portions of the sacrificial liner layer 123 while leaving residual portions of the sacrificial liner layer 123 on the sidewalls of the openings 124. This etching process also stops on the etch stop layer 116 and again exposes the etch stop layer 116.

Figure 1B:
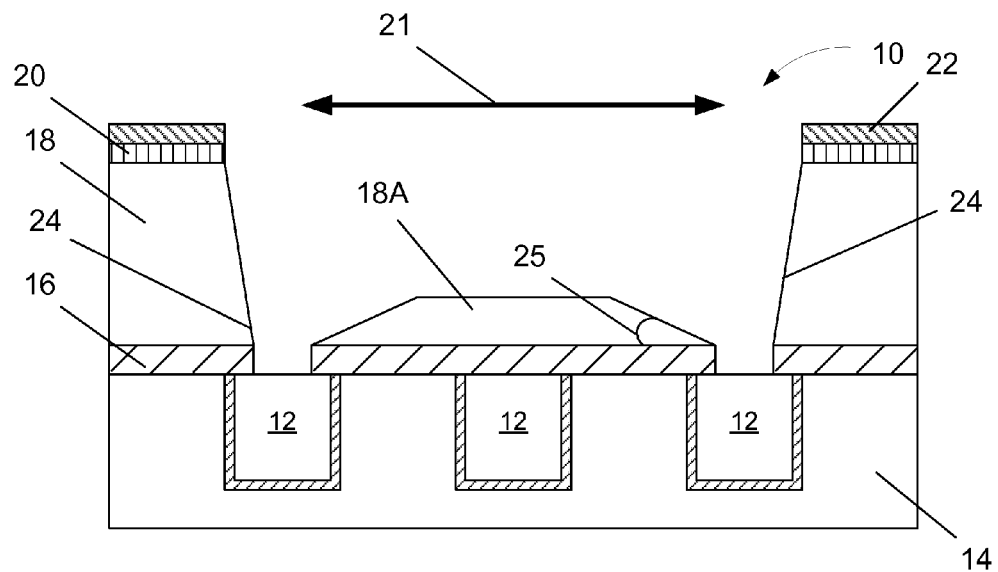
Figure 1C:
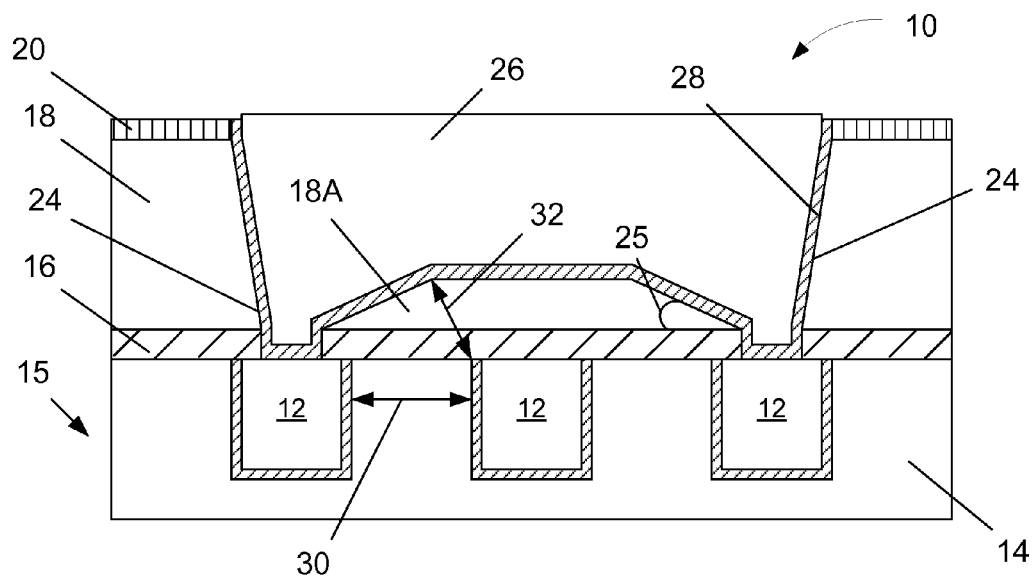
Figure 2D:
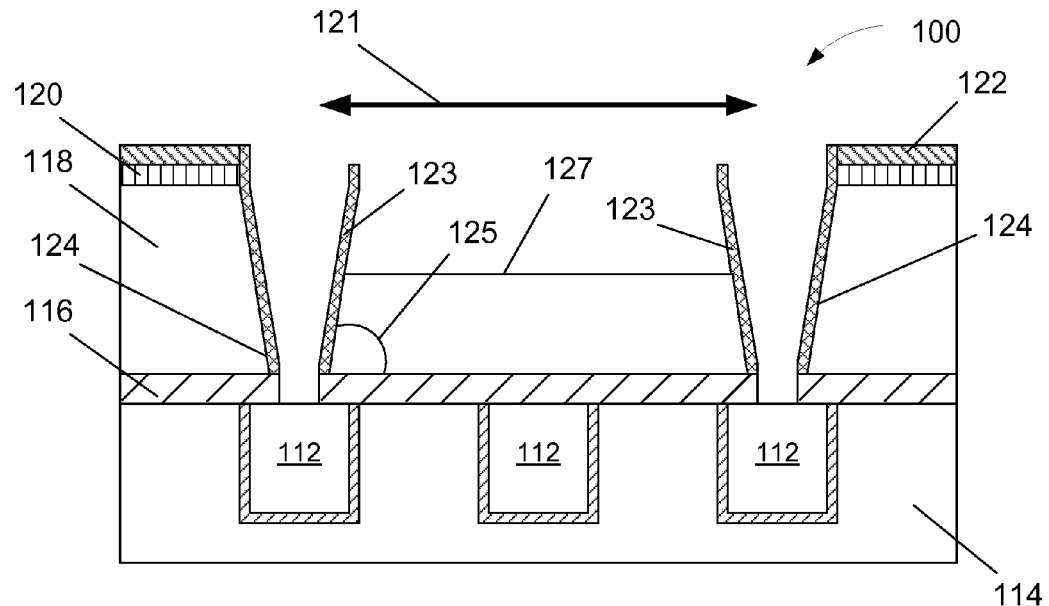

FIG. 2D depicts the product 100 after another etching process, such as a dry RIE trench etch process, was performed to form a trench 127 in the layer of insulating material 118. The trench 127 is for a conductive metal line that will run in the direction indicated by the double arrows 121. In contrast to the prior art process described in the background section of this application, due to the presence of the sacrificial liner layer 123, the trench etch process does not consume as much of the insulating material 118 positioned between the via openings 124. Compare FIG. 2D with FIG. 1B. Moreover, due to the presence of the sacrificial liner layer 123, the sidewall angle 125 of the layer of insulating material does not change from the angle that was formed when the via openings 124 were etched into the layer of insulating material 118. Additionally, the sidewall angle 125 is much larger than the sidewall angle 25. Compare FIG. 2D with FIG. 1B.

Figure 2E:
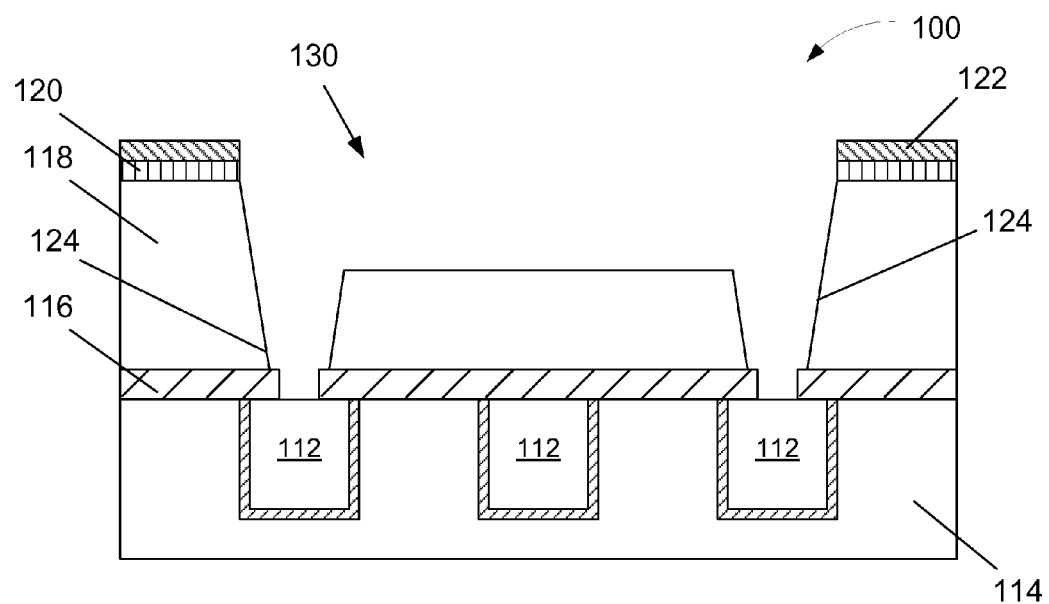

FIG. 2E depicts the product 100 after the residual portions of sacrificial liner layer 123 have been removed. In one embodiment, an etching process is performed to remove portions of the etch stop layer 116 so as to expose the underlying conductive structures 112. Then, in one embodiment, a separate dedicated etching process may be performed to remove the residual potions of the sacrificial liner layer 123 selectively relative to the surrounding structures, i.e., selective to the layer of insulating material 118. In another example, depending upon the particular material of construction selected for the sacrificial liner layer 123, the residual portions of the sacrificial liner layer 123 may be removed as part of a traditional wet clean process that is typically performed to clean the product of residual materials, e.g., residual insulating materials, prior to forming the conductive materials for the conductive line and via.

Figure 2F:
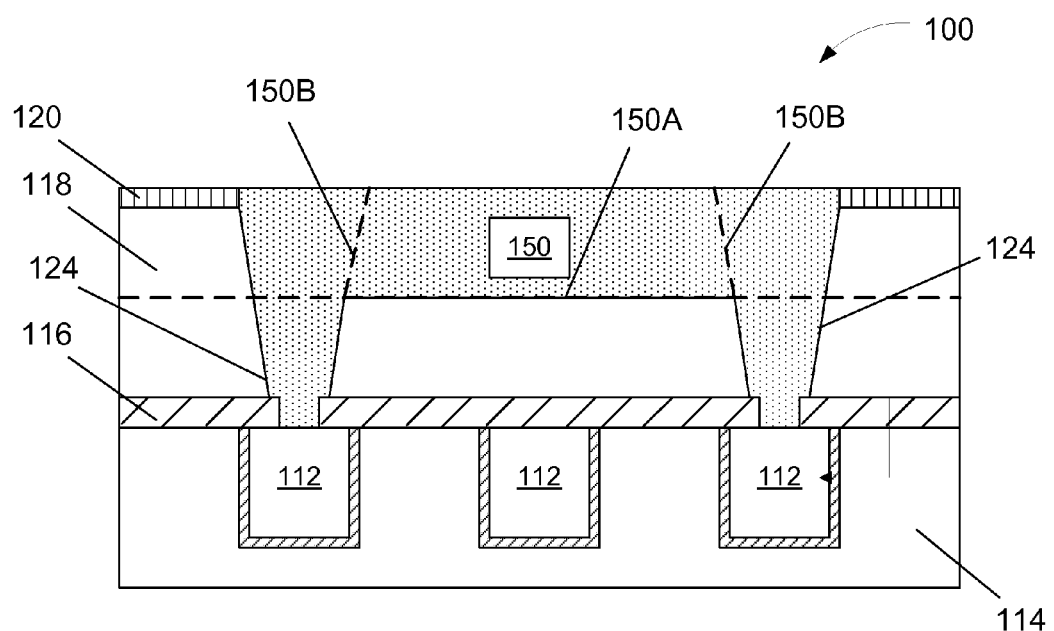

At this point in the process flow described herein, traditional manufacturing operations may be performed to form one or more conductive materials in the opening 130 shown in FIG. 2E, so as to thereby define the schematically depicted conductive structure 150 shown in FIG. 2F. In the example depicted herein, the conductive structure 150 comprises a line portion 150A and via portions 150B, which are shown in dashed lines. For ease of illustration, any barrier layers that are part of the conductive structure 150 are not shown in FIG. 2F. In general, the conductive structure 150 may be formed by performing one or more deposition processes to deposit one or more layers of barrier materials and or seed layers, e.g., a copper seed layer, above the product 100 and in the opening 130, and performing a bulk deposition process to overfill the opening with additional conductive material, such as bulk copper formed by performing an electroplating or an electroless deposition process. Thereafter, the product 100 is subjected to one or more CMP processes using techniques well known to those skilled in the art and briefly described above in the background section of this application. Such CMP processes also result in the removal of the layer 122. These process operations result in the illustrative conductive structure 150 shown in FIG. 2F.

As should be clear from the foregoing, the novel methods disclosed herein provide an efficient and effective means of forming conductive structures in integrated circuit products that may solve or at least reduce some of the problems identified in the background section of this application. Note that the use of terms, such as "first," "second," "third" or "fourth" to describe various etching processes in this specification and in the attached claims is only used as a shorthand reference to such etching stops and does not necessarily imply that such etching steps are performed in that ordered sequence. Of course, depending upon the exact claim language, an ordered sequence of such etching processes may or may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a first etching process to define a via opening in a layer of insulating material, said via opening having sidewalls;
    performing at least one process operation to form a sacrificial liner layer on said sidewalls of said via opening, wherein said sacrificial liner layer has a thickness that falls within the range of 1-5 nm;
    performing a second etching process on said layer of insulating material to define a trench in said layer of insulating material, wherein said sacrificial liner layer is exposed to said second etching process;
    after performing said second etching process, performing a third etching process to remove said sacrificial liner layer; and
    after performing said third etching process, forming a conductive structure in at least said via opening and said trench.

2. The method of claim 1, wherein said layer of insulating material is positioned above an etch stop layer and wherein said via opening exposes a portion of said etch stop layer.

3. The method of claim 1, wherein said layer of insulating material is comprised of silicon dioxide or an insulating material having a k value less than 3.3.

4. The method of claim 1, wherein said conductive structure is comprised of a metal or a metal alloy.

5. The method of claim 1, wherein performing said at least one process operation comprises:
    performing a conformal deposition process to initially form said sacrificial liner layer in at least said via opening and on said sidewalls of said via opening; and
    performing an etching process that removes portions of said initially formed sacrificial liner layer while leaving said sacrificial liner layer on said sidewalls of said via opening.

6. The method of claim 1, wherein said sacrificial liner layer is comprised of a low-temperature (formed at a temperature of less than 400° C.) oxide, a low-temperature (formed at a temperature of less than 400° C.) amorphous silicon, silicon nitride or TiN.

7. The method of claim 1, wherein said sacrificial liner layer is comprised of a material that may be selectively etched relative to said layer of insulating material.

8. A method, comprising:
    performing a first etching process to define an opening in a layer of insulating material, said opening having sidewalls;
    performing a conformal deposition process to form a sacrificial liner layer in at least said opening and on said sidewalls of said opening;

performing a second etching process that removes some of said sacrificial liner layer and leaves residual portions of said sacrificial liner layer adjacent said sidewalls of said opening;

performing a third etching process on said layer of insulating material, wherein said residual portions of said sacrificial liner layer are exposed to said third etching process;

after performing said third etching process, performing a fourth etching process to remove said residual portions of said sacrificial liner layer; and after performing said fourth etching process, forming a conductive structure in at least said opening.

9. The method of claim 8, wherein said layer of insulating material is positioned above an etch stop layer and wherein said opening exposes a portion of said etch stop layer.

10. The method of claim 8, wherein said layer of insulating material is comprised of an insulating material having a k value less than 3.3.

11. The method of claim 8, wherein said conductive structure is comprised of a metal or a metal alloy.

12. The method of claim 8, wherein performing said second etching process comprises performing a reactive ion etching process.

13. The method of claim 8, wherein said sacrificial liner layer is comprised of a low-temperature (formed at a temperature of less than 400° C.) oxide, a low-temperature (formed at a temperature of less than 400° C.) amorphous silicon, silicon nitride or TiN.

14. The method of claim 8, wherein said sacrificial liner layer is comprised of a material that may be selectively etched relative to said layer of insulating material.

15. A method, comprising:

forming a layer of insulating material above an etch stop layer;

performing a first etching process to define a via opening in said layer of insulating material that exposes a portion of said etch stop layer, said via opening having sidewalls;

performing a conformal deposition process to form a sacrificial liner layer in at least said via opening and adjacent said sidewalls of said via opening, wherein said sacrificial liner layer covers said exposed portion of said etch stop layer;

performing a second, reactive ion etching process on said sacrificial liner layer that uncovers said exposed portion of said etch stop layer and leaves residual portions of said sacrificial liner layer adjacent said sidewalls of said via opening;

performing a third etching process on said layer of insulating material to define a trench in said layer of insulating material, wherein said residual portions of said sacrificial liner layer are exposed to said third etching process;

after performing said third etching process, performing a fourth etching process to remove said residual portions of said sacrificial liner layer; and after performing said fourth etching process, forming a conductive structure in at least said via opening and said trench.

16. The method of claim 15, wherein said sacrificial liner layer is comprised of a material that may be selectively etched relative to said layer of insulating material.

17. The method of claim 15, wherein said etch stop liner is comprised of silicon nitride.

18. The method of claim 15, wherein said sacrificial liner layer is comprised of a low-temperature (formed at a temperature of less than 400° C.) oxide, a low-temperature (formed at a temperature of less than 400° C.) amorphous silicon, silicon nitride or TiN.

19. A method, comprising:

performing a first etching process to define a via opening in a layer of insulating material, said via opening having sidewalls;

performing at least one process operation to form a sacrificial liner layer on said sidewalls of said via opening, wherein performing said at least one process operation comprises:

performing a conformal deposition process to initially form said sacrificial liner layer in at least said via opening and on said sidewalls of said via opening; and performing an etching process that removes portions of said initially formed sacrificial liner layer while leaving said sacrificial liner layer on said sidewalls of said via opening;

performing a second etching process on said layer of insulating material to define a trench in said layer of insulating material, wherein said sacrificial liner layer is exposed to said second etching process;

after performing said second etching process, performing a third etching process to remove said sacrificial liner layer; and after performing said third etching process, forming a conductive structure in at least said via opening and said trench.

20. A method, comprising:

performing a first etching process to define an opening in a layer of insulating material, said opening having sidewalls;

forming a sacrificial liner layer in at least said opening and adjacent said sidewalls of said opening;

performing a second etching process that removes some of said sacrificial liner layer and leaves residual portions of said sacrificial liner layer adjacent said sidewalls of said opening, wherein performing said second etching process comprises performing a reactive ion etching process;

performing a third etching process on said layer of insulating material, wherein said residual portions of said sacrificial liner layer are exposed to said third etching process;

after performing said third etching process, performing a fourth etching process to remove said residual portions of said sacrificial liner layer; and after performing said fourth etching process, forming a conductive structure in at least said opening.

21. The method of claim 20, wherein said sacrificial liner layer has a thickness that falls within the range of 1-5 nm.

22. The method of claim 20, wherein said forming a sacrificial liner layer comprises performing a conformal deposition process to form said sacrificial liner layer in at least said opening and on said sidewalls of said opening.

* * * * *